(12) United States Patent
Huang et al.

(10) Patent No.: US 10,937,830 B2
(45) Date of Patent: Mar. 2, 2021

(54) METHOD OF FABRICATING INTEGRATED CIRCUIT

(71) Applicant: United Semiconductor (Xiamen) Co., Ltd., Fujian (CN)

(72) Inventors: Chin-Chun Huang, Hsinchu County (TW); Yun-Pin Teng, Tainan (TW); You-Di Jhang, New Taipei (TW); Wen Yi Tan, Fujian (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 0 days.

(21) Appl. No.: 16/868,495

(22) Filed: May 6, 2020

(65) Prior Publication Data

US 2020/0266237 A1 Aug. 20, 2020

Related U.S. Application Data

(62) Division of application No. 16/231,615, filed on Dec. 24, 2018, now Pat. No. 10,692,929.

(30) Foreign Application Priority Data

Dec. 5, 2018 (CN) .......................... 201811478155.0

(51) Int. Cl.
*H01L 27/24* (2006.01)
*H01L 45/00* (2006.01)

(52) U.S. Cl.
CPC ...... *H01L 27/2409* (2013.01); *H01L 45/1233* (2013.01); *H01L 45/1675* (2013.01)

(58) Field of Classification Search
CPC . H01L 45/1253; H01L 45/04; H01L 45/1233; H01L 45/146; H01L 45/1675; H01L 45/122; H01L 45/1608; H01L 27/2436; H01L 45/1666; H01L 45/14; H01L 45/145; H01L 23/5226; H01L 23/528; H01L 45/147; H01L 27/2409
USPC .......................................................... 257/2
See application file for complete search history.

(56) References Cited

U.S. PATENT DOCUMENTS

9,064,719 B1 6/2015 Zhou

*Primary Examiner* — Caleen O Sullivan
(74) *Attorney, Agent, or Firm* — Winston Hsu (57) ABSTRACT

An integrated circuit includes: a substrate having a resistive random-access memory area and a resistor area; a first dielectric layer and a second dielectric layer sequentially disposed on the substrate; a patterned stacked structure having a bottom conductive layer, an insulating layer and a top conductive layer stacked from bottom to top sandwiched by the first dielectric layer and the second dielectric layer; a first metal plug and a second metal plug disposed in the second dielectric layer and contacting the top conductive layer and the bottom conductive layer of the resistive random-access memory area respectively, thereby constituting a resistive random-access memory cell; and, a third metal plug and a fourth metal plug disposed in the second dielectric layer and contacting the bottom conductive layer or the top conductive layer of the resistor area, thereby constituting a resistor cell. A method of forming said integrated circuit is also provided.

2 Claims, 7 Drawing Sheets

METHOD OF FABRICATING INTEGRATED CIRCUIT

CROSS REFERENCE TO RELATED APPLICATIONS

This application is a divisional application of and claims the benefit of U.S. patent application Ser. No. 16/231,615, filed Dec. 24, 2018.

BACKGROUND OF THE INVENTION

1. Field of the Invention

The present invention relates generally to an integrated circuit and forming method thereof, and more specifically to an integrated circuit including a resistive random-access memory cell and a resistor cell and forming method thereof.

2. Description of the Prior Art

Resistive random-access memories and resistors are widely used in digital circuits in current semiconductor industries. As the integration of electrical circuits increases, it becomes mainstream to forma semiconductor device by integrating transistors, resistive random-access memories and resistors into one same semiconductor substrate.

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance. Moreover, the operating theory of a resistor is to connect ends of a conductive material. As a current passes through the conductive material, the resistance depends upon the resistivity of the conductive material, the cross sectional area and the length passed through by the current occurs.

According to the above, how to integrate resistive random-access memories and resistors in a same semiconductor substrate, especially in a same semiconductor process, becomes an important issue in current semiconductor industry.

SUMMARY OF THE INVENTION

The present invention provides an integrated circuit including a resistive random-access memory cell and a resistor cell and forming method thereof, which forms the resistive random-access memory cell and the resistor cell simultaneously by same processes.

The present invention provides an integrated circuit including a resistive random-access memory cell and a resistor cell. The integrated circuit includes a substrate, a first dielectric layer, a second dielectric layer, a patterned stacked structure, a first metal plug, a second metal plug, a third metal plug and a fourth metal plug. The substrate has a resistive random-access memory area and a resistor area. The first dielectric layer and the second dielectric layer are sequentially disposed on the substrate. The patterned stacked structure having a bottom conductive layer, an insulating layer and a top conductive layer stacked from bottom to top is sandwiched by the first dielectric layer and the second dielectric layer. The first metal plug and the second metal plug are disposed in the second dielectric layer and contact the top conductive layer and the bottom conductive layer of the resistive random-access memory area respectively, thereby constituting the resistive random-access memory cell. The third metal plug and the fourth metal plug are disposed in the second dielectric layer and contact the bottom conductive layer or the top conductive layer of the resistor area, thereby constituting the resistor cell.

The present invention provides a method of fabricating an integrated circuit including a resistive random-access memory cell and a resistor cell, including the following steps. A substrate having a resistive random-access memory area and a resistor area is provided. A first dielectric layer is deposited on the substrate blanketly. A bottom conductive layer, an insulating layer and a top conductive layer are deposited and etched to form a patterned stacked structure in the resistive random-access memory area and the resistor area. A second dielectric layer is deposited on the patterned stacked structure. A first metal plug, a second metal plug, a third metal plug and a fourth metal plug are formed in the second dielectric layer simultaneously, wherein the first metal plug and the second metal plug contact the top conductive layer and the bottom conductive layer of the resistive random-access memory area respectively, thereby the patterned stacked structure in the resistive random-access memory area constituting the resistive random-access memory cell, and third metal plug and the fourth metal plug contact the bottom conductive layer or the top conductive layer of the resistor area, thereby the patterned stacked structure in the resistor area constituting the resistor cell.

According to the above, the present invention provides an integrated circuit including a resistive random-access memory cell and a resistor cell and forming method thereof, wherein a first dielectric layer and a second dielectric layer are sequentially disposed on a substrate of a resistive random-access memory area and a resistor area; a patterned stacked structure having a bottom conductive layer, an insulating layer and a top conductive layer stacked from bottom to top is sandwiched by the first dielectric layer and the second dielectric layer of the resistive random-access memory area and the resistor area; a first metal plug and a second metal plug contact the top conductive layer and the bottom conductive layer of the resistive random-access memory area respectively, thereby constituting the resistive random-access memory cell; and, a third metal plug and a fourth metal plug contact the bottom conductive layer or the top conductive layer of the resistor area, thereby constituting the resistor cell. In this way, processes of forming the resistive random-access memory cell and the resistor cell can be integrated and simplified, and thus processing costs can be reduced.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-7 schematically depict cross-sectional views of a method of fabricating an integrated circuit according to an embodiment of the present invention. A substrate 110 including a resistive random-access memory area A, a resistor area B and a logic area C is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 are disposed in the substrate 110, wherein the isolation structures 10 may be shallow trench isolation (STI) structures, which is formed by a shallow trench isolation (STI) process, but it is not limited thereto. Transistors M1/M2 are formed, a contact etch stop layer 20 is conformally formed and a first dielectric layer 120 is deposited on the substrate 110 blanketly, wherein the forming methods are well known in the art, and are not described herein. In this embodiment, the first dielectric layer 120 may be an inter-dielectric layer, and the transistors M1/M2 may be transistors having high-k dielectric layers, which may be formed in the first dielectric layer 120 by a metal gate replacement process, but it is not limited thereto. In a preferred embodiment, the transistors M1/M2 may include a transistor M1 and dummy transistors M2, wherein the transistor M1 is disposed in the logic area C and the dummy transistors M2 are disposed in the resistor area B to avoid an uneven surface of the first dielectric layer 120 caused by the loading effect while planarizing the first dielectric layer 120. The isolation structures 10 in the substrate 110 are disposed right below the dummy transistors M2 and directly contact the dummy transistors M2, to prevent circuit leakage flowing from the dummy transistors M2 to the substrate 110.

Figure 1:
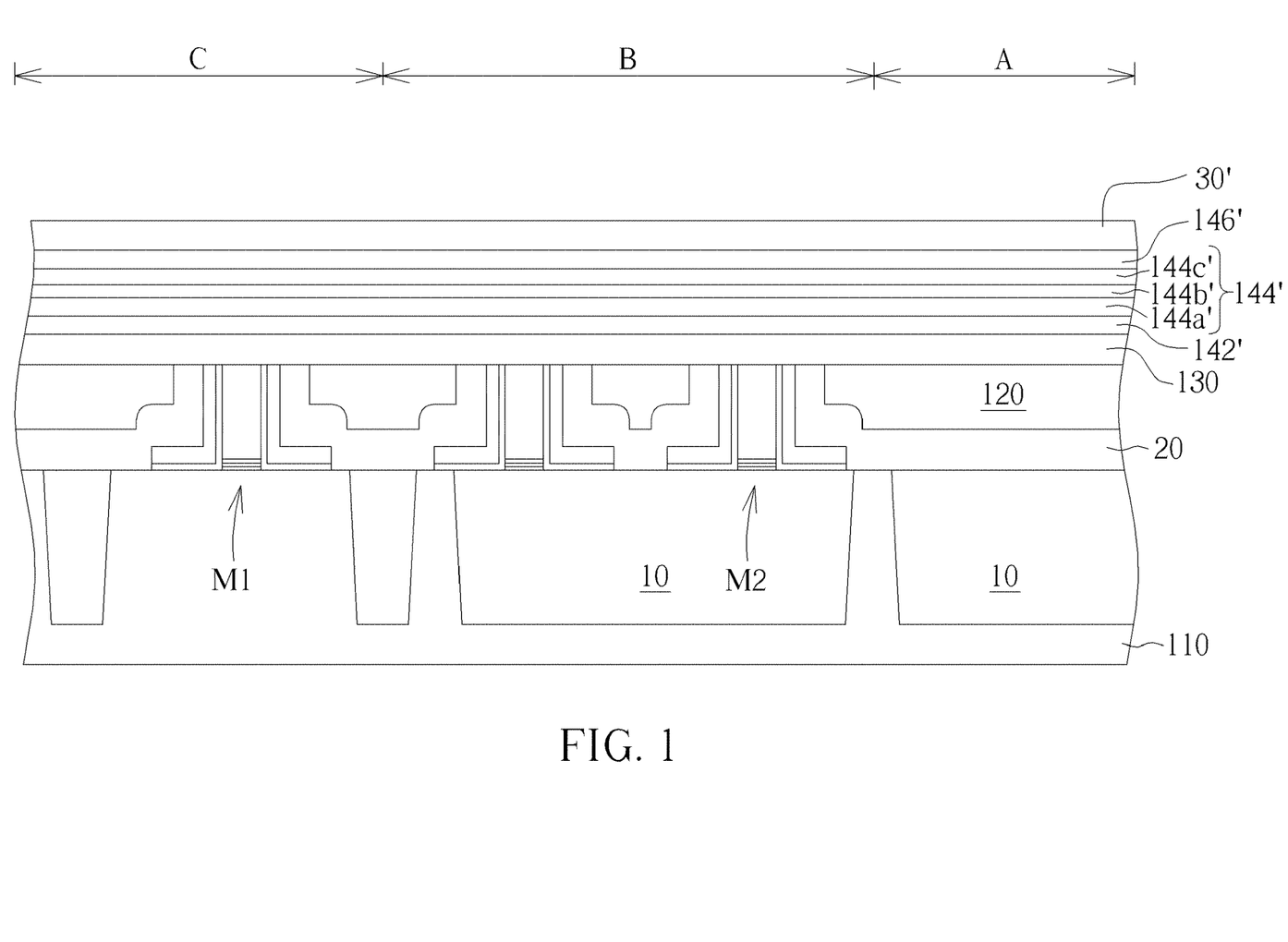
FIG. 1 schematically depicts a cross-sectional view of a method of fabricating an integrated circuit according to an embodiment of the present invention.

A dielectric layer 130 is formed on the first dielectric layer 120. In this case, the dielectric layer 130 may be an oxide layer, which may be formed by a chemical oxide process, but it is not limited thereto. In other cases, the dielectric layer 130 may be other insulating layers. A bottom conductive layer 142', an insulating layer 144' and a top conductive layer 146' are blanketly deposited on the dielectric layer 130. A cap layer 30' covers the top conductive layer 146'. In this embodiment, the insulating layer 144' may include at least a transition metal oxide layer, and the insulating layer 144' may include a stacked insulating layer, but it is not limited thereto. Preferably, the bottom conductive layer 142' and the top conductive layer 146' may include titanium nitride (TiN), tantalum nitride (TaN), titanium (Ti), tantalum (Ta), copper or aluminum etc, and the insulating layer 144' may include a tantalum oxide ($TaO_x$) layer 144a', a tantalum oxide ($Ta_2O_5$) layer 144b', an iridium (Ir) layer 144c' stacked from bottom to top, but it is not limited thereto. In other cases, the insulating layer 144' may be a single layer or multilayers, which may include the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The cap layer 30' may be a nitride layer, but it is not limited thereto.

Figure 2:
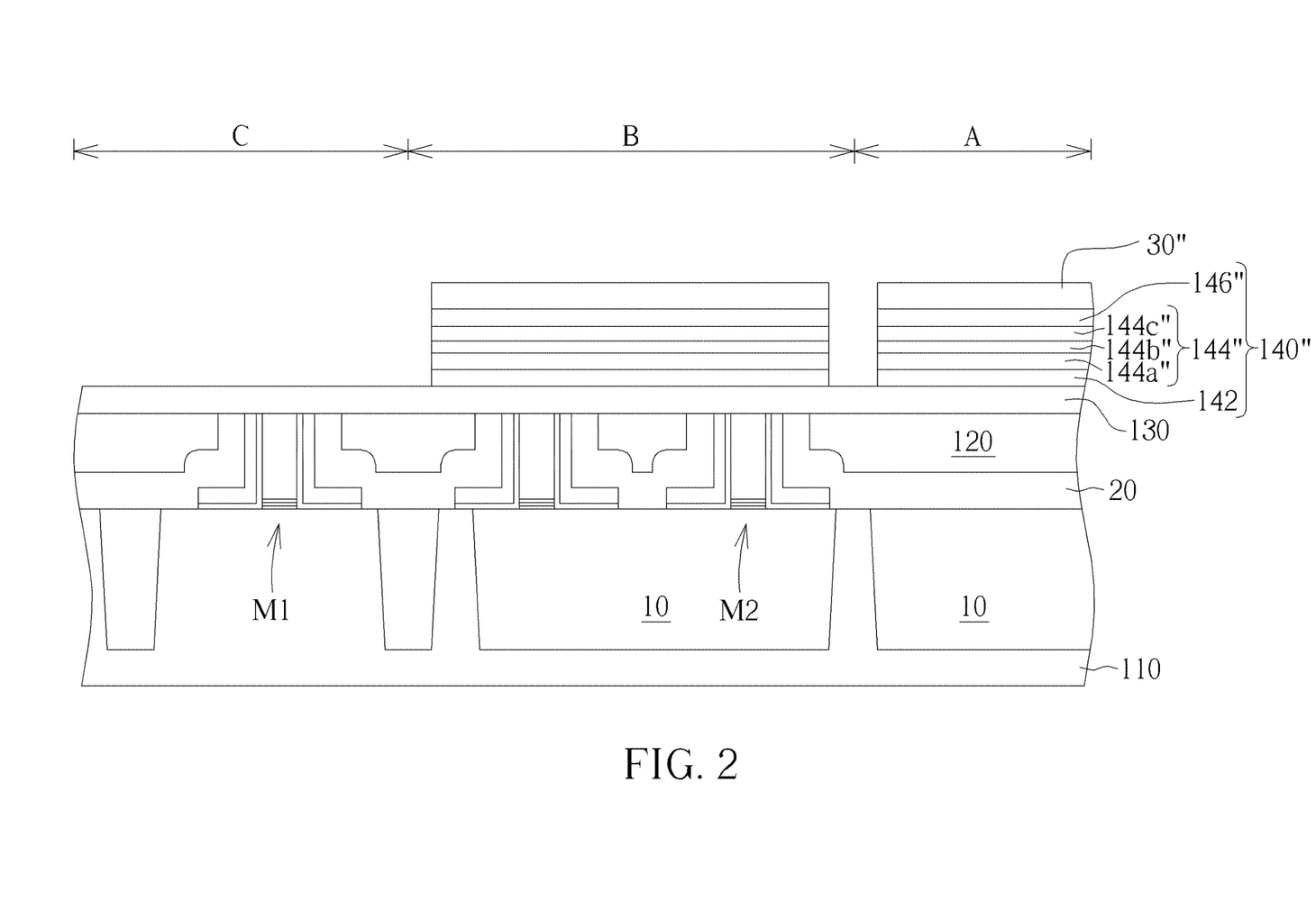
FIG. 2 schematically depicts a cross-sectional view of a method of fabricating an integrated circuit according to an embodiment of the present invention.

And then, the cap layer 30', the top conductive layer 146', the insulating layer 144' and the bottom conductive layer 142' are patterned, thereby a patterned stacked structure 140" is formed on the dielectric layer 130, a cap layer 30" is formed on the patterned stacked structure 140", and the patterned stacked structure 140" and the cap layer 30' are only in the resistive random-access memory area A and the resistor area B, as shown in FIG. 2. The patterned stacked structure 140" may include a bottom conductive layer 142, an insulating layer 144' and a top conductive layer 146' stacked from bottom to top, and the insulating layer 144" may include a tantalum oxide ($TaO_x$) layer 144a", a tantalum oxide ($Ta_2O_5$) layer 144b" and an iridium (Ir) layer 144c", but it is not limited thereto.

Figure 3:
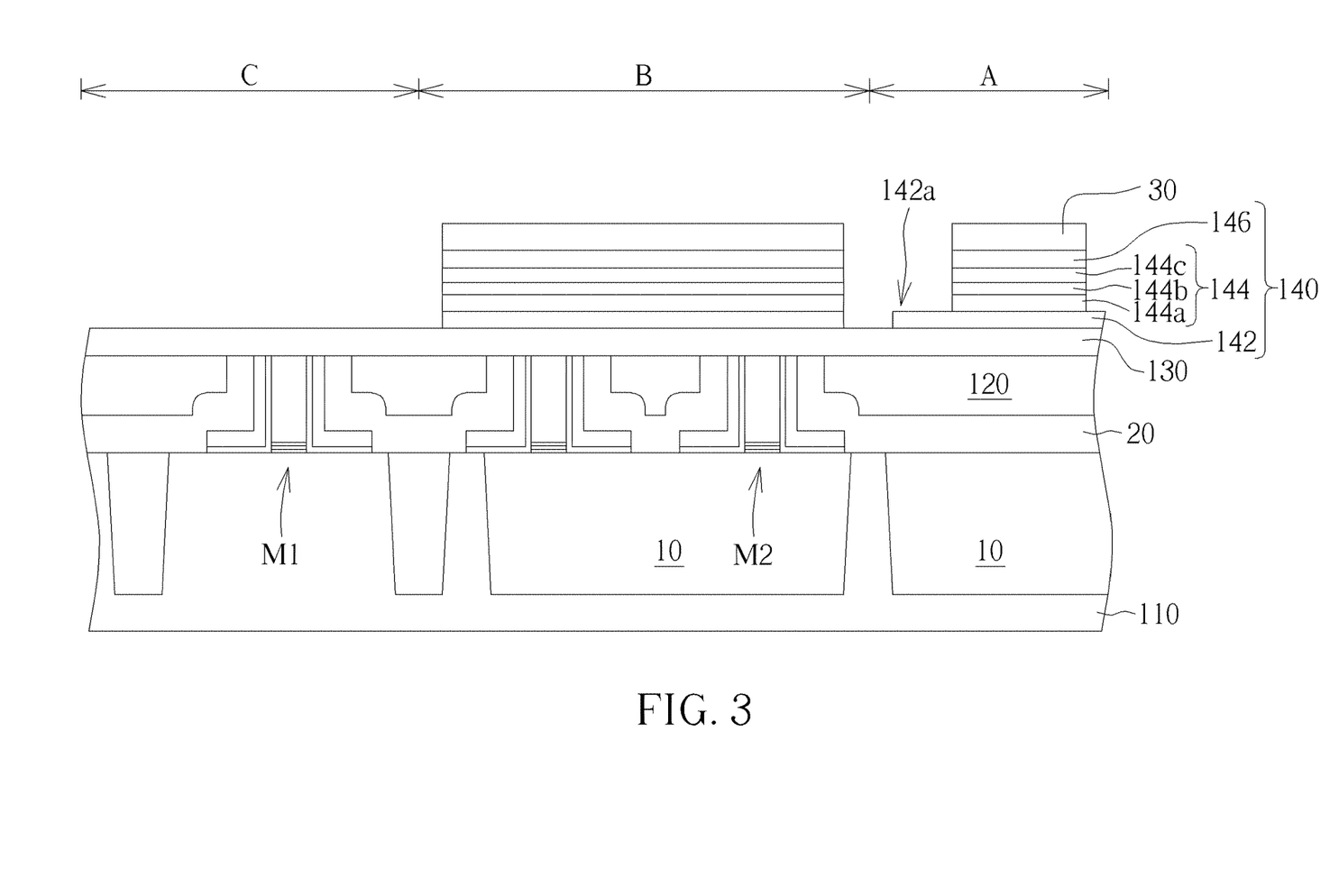
FIG. 3 schematically depicts a cross-sectional view of a method of fabricating an integrated circuit according to an embodiment of the present invention.

In this embodiment, only the cap layer 30", the top conductive layer 146" and the insulating layer 144" in the resistive random-access memory area A are etched to expose a part 142a of the bottom conductive layer 142, and a patterned stacked structure 140 including the bottom conductive layer 142, an insulating layer 144, a top conductive layer 146 and a cap layer 30 is formed, wherein the insulating layer 144 may include a tantalum oxide ($TaO_x$) layer 144a, a tantalum oxide ($Ta_2O_5$) layer 144b, an iridium (Ir) layer 144c, but it is not limited thereto, as shown in FIG. 3. The bottom conductive layer 142 protrudes from the top conductive layer 146 to connect to metal plugs in later processes. The dielectric layer 130 is disposed between the first dielectric layer 120 and the patterned stacked structure 140 to isolate the patterned stacked structure 140 from the first dielectric layer 120.

Figure 4:
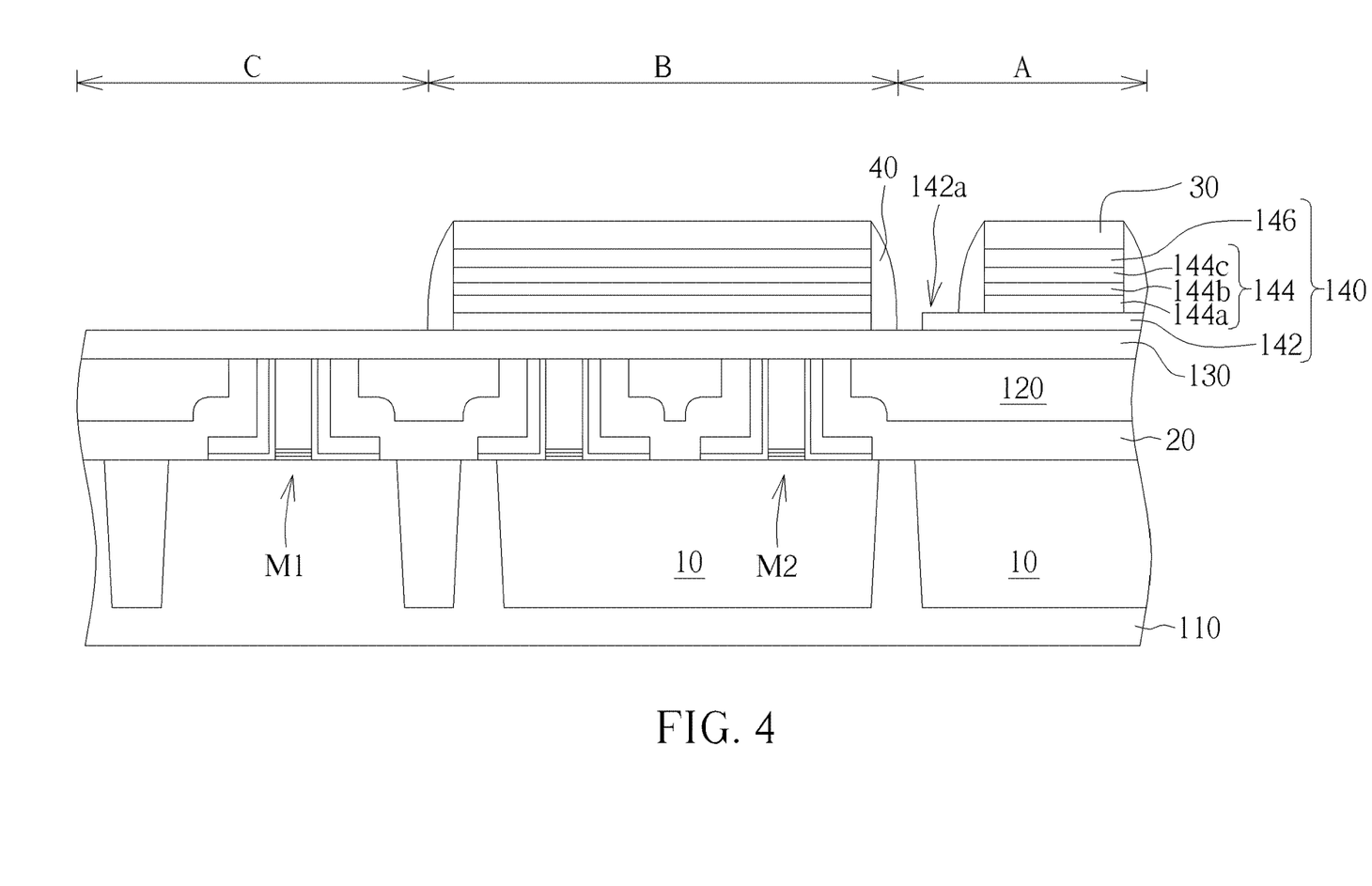
FIG. 4 schematically depicts a cross-sectional view of a method of fabricating an integrated circuit according to an embodiment of the present invention.

As shown in FIG. 4, spacers 40 are formed on sidewalls of the patterned stacked structure 140. In a preferred embodiment, the spacers 40 are right next to the insulating layer 144 and the top conductive layer 146 and are on the bottom conductive layer 142 in the resistive random-access memory area A, but the whole spacers 40 are on the sidewalls of the patterned stacked structure 140 in the resistor area B.

Figure 5:
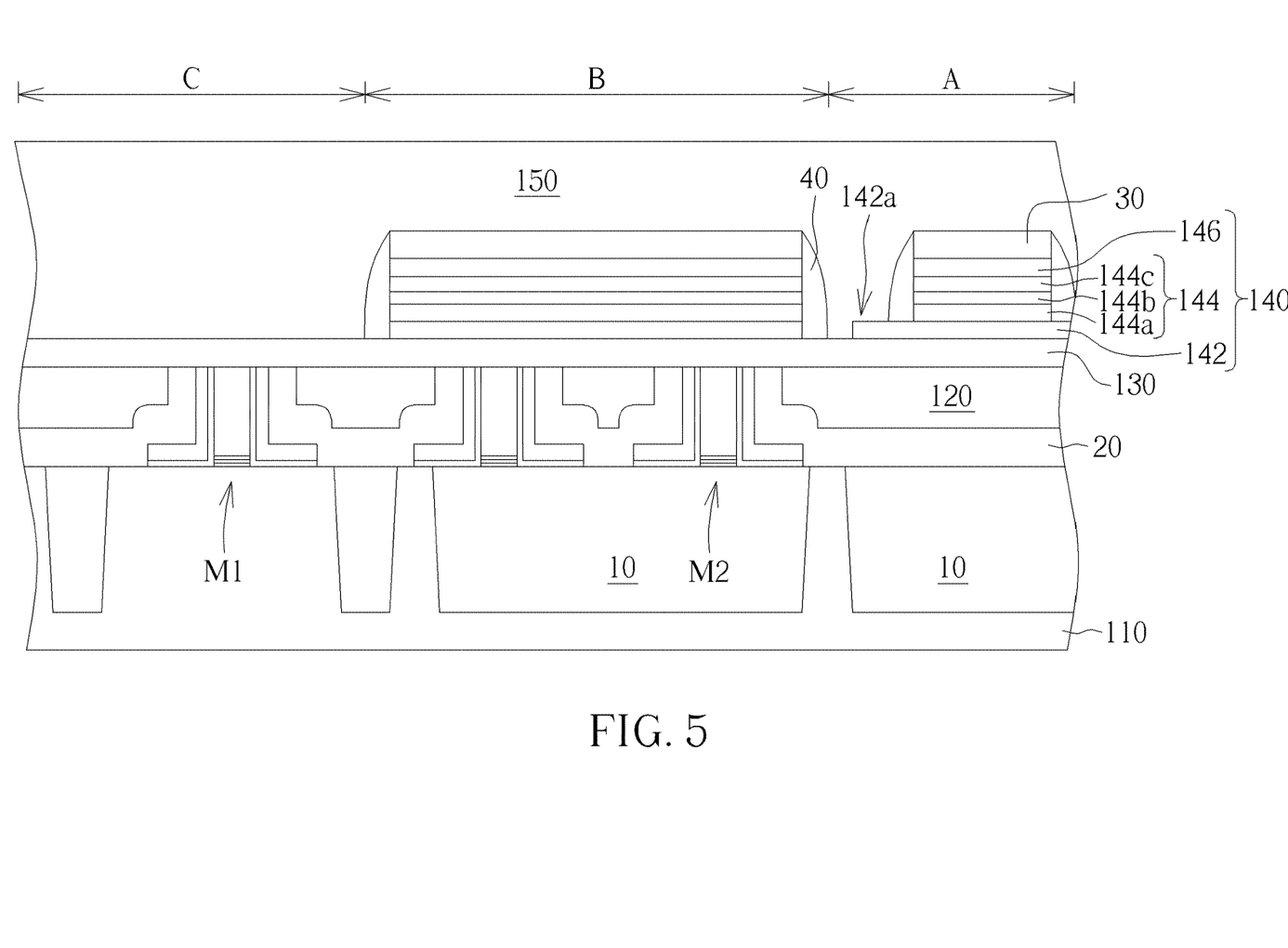
FIG. 5 schematically depicts a cross-sectional view of a method of fabricating an integrated circuit according to an embodiment of the present invention.

As shown in FIG. 5, a second dielectric layer 150 is deposited to cover the patterned stacked structure 140. Methods of forming the second dielectric layer 150 may include blanketly depositing and planarizing a second dielectric layer to form the second dielectric layer 150 having an even top surface. The second dielectric layer 150 may be an oxide layer, which may be formed by a chemical oxide process, but it is not limited thereto. Thereby, the patterned stacked structure 140 is sandwiched by the first dielectric layer 120/the dielectric layer 130 and the second dielectric layer 150.

Figure 6:
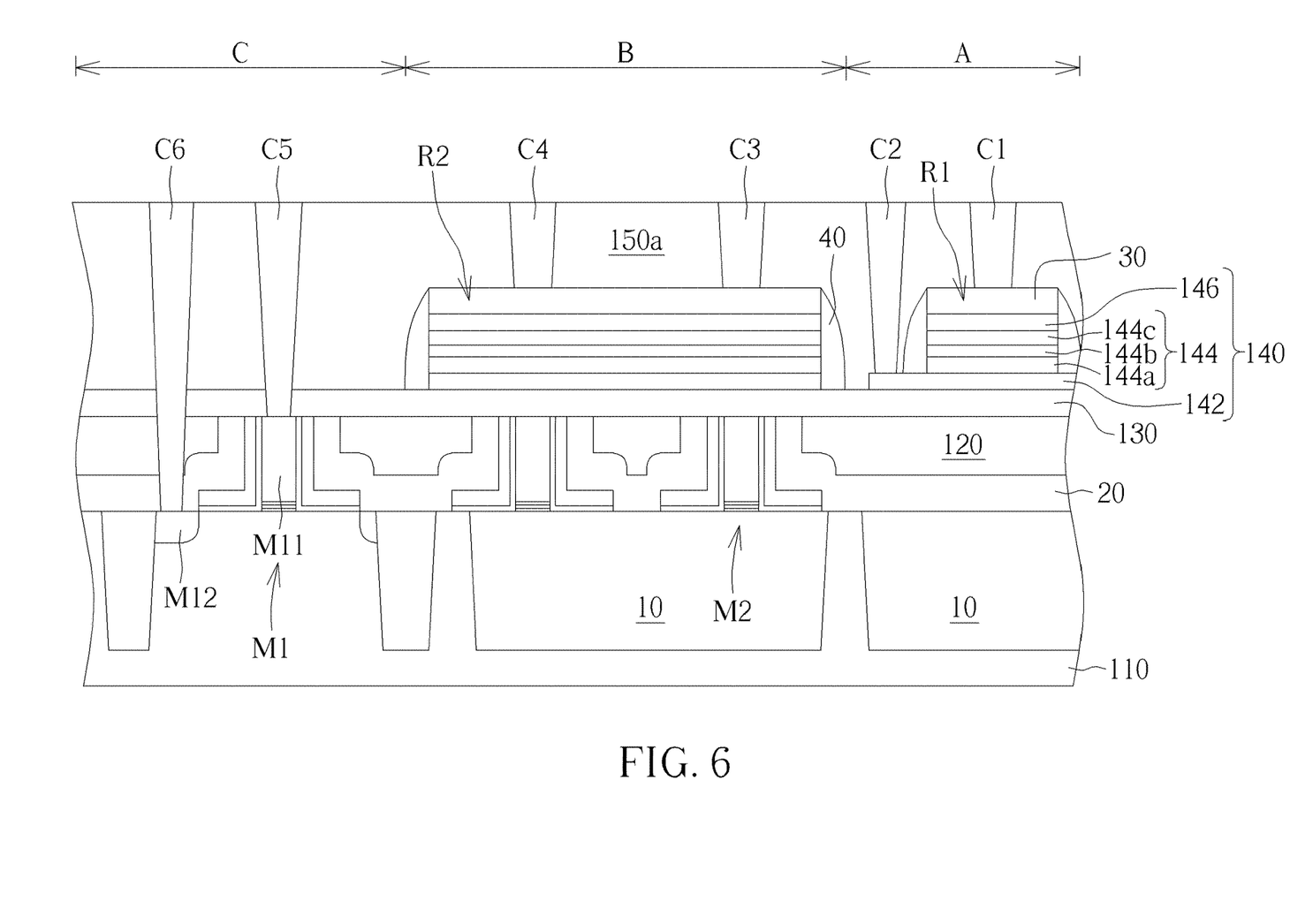
FIG. 6 schematically depicts a cross-sectional view of a method of fabricating an integrated circuit according to an embodiment of the present invention.

Then, the second dielectric layer 150 may be patterned by methods such as etching to form a plurality of metal plugs in the second dielectric layer 150a, as shown in FIG. 6. More precisely, contact holes may be formed in the second dielectric layer 150 and then metals are filled into the contact holes, to form a first metal plug C1, a second metal plug C2, a third metal plug C3, a fourth metal plug C4, a metal plug C5 and a metal plug C6 in the second dielectric layer 150a.

Metals may be copper, but it is not limited thereto. The first metal plug C1 and the second metal plug C2 contact the top conductive layer 146 and the bottom conductive layer 142 of the resistive random-access memory area A respectively, thereby the patterned stacked structure 140 in the resistive random-access memory area A constituting a resistive random-access memory cell R1. In this case, the third metal plug C3 and the fourth metal plug C4 contact the top conductive layer 146 of the resistor area B, thereby the patterned stacked structure 140 in the resistor area B constituting a resistor cell R2. In another case, the third metal plug C3 and the fourth metal plug C4 may contact the bottom conductive layer 142 of the resistor area B instead, thereby the patterned stacked structure 140 in the resistor area B constituting a resistor cell, wherein the bottom conductive layer 142 must be exposed while forming contact holes.

In the logic area C, the metal plug C5 and the metal plug C6 are disposed in the second dielectric layer 150a, penetrate the dielectric layer 130 and directly contact the transistor M1 in the first dielectric layer 120. In details, the metal plug C5 directly contacts a metal gate M11 of the transistor M1 while the metal plug C6 directly contacts a source/drain M12 of the transistor M1.

It is emphasized that, the resistive random-access memory cell R1 is insulated from the resistor cell R2, therefore the resistive random-access memory cell R1 and the resistor cell R2 can be operated individually. In this embodiment, the dielectric layer 130 contacts the second dielectric layer 150a between the patterned stacked structure 140 of the resistive random-access memory cell R1 and the patterned stacked structure 140 of the resistor cell R2, thereby the resistive random-access memory cell R1 can being insulated from the resistor cell R2. Moreover, the resistive random-access memory cell R1 and the resistor cell R2 are formed by the same process and disposed in a same (horizontal) level. More precisely, the bottom conductive layer 142 of the resistive random-access memory cell R1 and the bottom conductive layer 142 of the resistor cell R2 are disposed in a same (horizontal) level; the insulating layer 144 of the resistive random-access memory cell R1 and the insulating layer 144 of the resistor cell R2 are disposed in a same (horizontal) level; the top conductive layer 146 of the resistive random-access memory cell R1 and the top conductive layer 146 of the resistor cell R2 are disposed in a same (horizontal) level.

Figure 7:
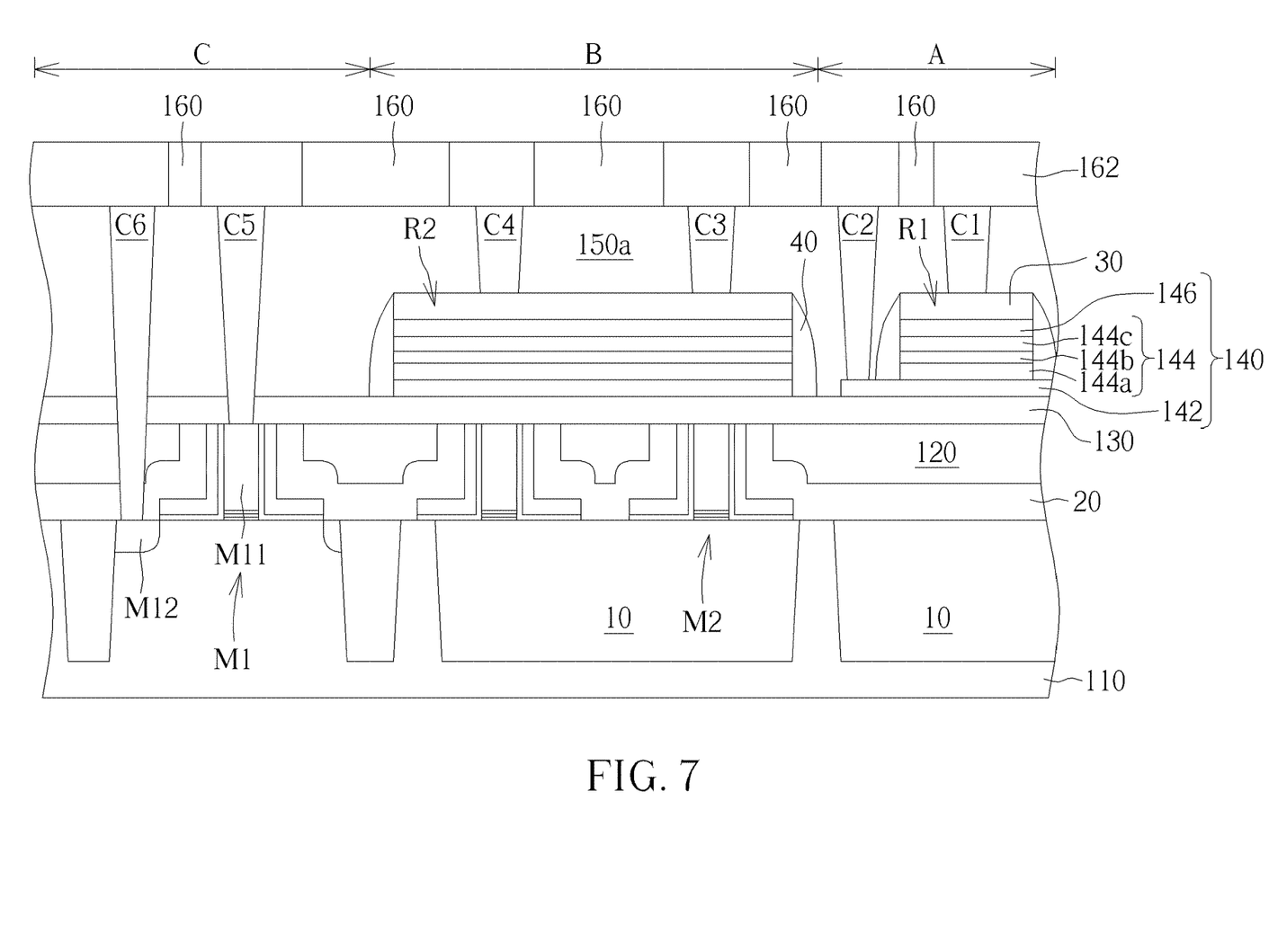
FIG. 7 schematically depicts a cross-sectional view of a method of fabricating an integrated circuit according to an embodiment of the present invention.

As shown in FIG. 7, a third dielectric layer 160 is formed on the second dielectric layer 150a, and the third dielectric layer 160 may include a metal interconnect 162 electrically connecting the first metal plug C1, the second metal plug C2, the third metal plug C3, the fourth metal plug C4, the metal plug C5 and the metal plug C6.

Above all, the resistive random-access memory cell R1 is formed by connecting the bottom conductive layer 142 and the top conductive layer 146 in the resistive random-access memory area A while the resistor cell R2 is formed by connecting the bottom conductive layer 142 or the top conductive layer 146 in the resistor area B. Therefore, the present invention integrates a resistive random-access memory, a non-inductive resistor and a transistor in a logic area by the same processes, thereby the processes being simplified and the processing costs being reduced. Moreover, the present invention can be integrated into logic circuit processes, dual damascene processes or organic redistribution layout processes etc.

To summarize, the present invention provides an integrated circuit including a resistive random-access memory cell and a resistor cell and forming method thereof, wherein a first dielectric layer and a second dielectric layer are sequentially disposed on a substrate of a resistive random-access memory area and a resistor area; a patterned stacked structure having a bottom conductive layer, an insulating layer and a top conductive layer stacked from bottom to top is sandwiched by the first dielectric layer and the second dielectric layer of the resistive random-access memory area and the resistor area; a first metal plug and a second metal plug are disposed in the second dielectric layer and contact the top conductive layer and the bottom conductive layer of the resistive random-access memory area respectively, thereby constituting the resistive random-access memory cell; and, a third metal plug and a fourth metal plug are disposed in the second dielectric layer and contact the bottom conductive layer or the top conductive layer of the resistor area, thereby constituting the resistor cell. In this way, processes of forming the resistive random-access memory cell and the resistor cell can be integrated and simplified, and thus processing costs can be reduced.

Furthermore, metal plugs may be disposed in the second dielectric layer of a logic area and directly contact transistors in the first dielectric layer. The first metal plug and the second metal plug in the resistive random-access memory area, the third metal plug and the fourth metal plug in the resistor area, and the metal plugs in the logic area can be formed by same processes. The present invention can be integrated into logic circuit processes, dual damascene processes or organic redistribution layout processes etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an integrated circuit comprising a resistive random-access memory cell and a resistor cell, comprising:

providing a substrate having a resistive random-access memory area and a resistor area;

depositing a first dielectric layer on the substrate blanketly;

depositing and etching a bottom conductive layer, an insulating layer and a top conductive layer to form a patterned stacked structure in the resistive random-access memory area and the resistor area;

depositing a second dielectric layer on the patterned stacked structure; and forming a first metal plug, a second metal plug, a third metal plug and a fourth metal plug in the second dielectric layer simultaneously, wherein the first metal plug and the second metal plug contacting the top conductive layer and the bottom conductive layer of the resistive random-access memory area respectively, thereby the patterned stacked structure in the resistive random-access memory area constituting the resistive random-access memory cell, and the third metal plug and the fourth metal plug contacting the bottom conductive layer or the top conductive layer of the resistor area, thereby the patterned stacked structure in the resistor area constituting the resistor cell, wherein the substrate comprises a logic area, transistors are in the first dielectric layer of the logic area, and metal plugs are formed in the second dielectric layer to contact to the transistors while the first metal plug, the second metal plug, the third metal plug and the fourth metal plug are formed in the second dielectric layer.

2. The method of fabricating an integrated circuit according to claim 1, wherein only the top conductive layer and the insulating layer in the resistive random-access memory area are etched to expose a part of the bottom conductive layer while the patterned stacked structure is formed.

\* \* \* \* \*